United States Patent
Nam et al.

[11] Patent Number: 5,899,690
[45] Date of Patent: May 4, 1999

[54] THERMAL PROCESSING APPARATUS FOR SEMICONDUCTOR WAFER

[75] Inventors: Ki-hum Nam, Suwon; Byung-kwan Lee, Pupyoung-gu; Dong-ho Kim, Suwon; Woung-kwan An, Pupyoung-gu, all of Rep. of Korea

[73] Assignee: Samsung Electronics Co., Ltd., Suwon, Rep. of Korea

[21] Appl. No.: 08/923,465

[22] Filed: Sep. 4, 1997

[30] Foreign Application Priority Data

Sep. 5, 1996 [KR] Rep. of Korea .................. 96-38477

[51] Int. Cl.⁶ .................................................. F27D 3/12
[52] U.S. Cl. ........................................ 432/241; 432/121
[58] Field of Search ..................... 432/86, 87, 121–122, 432/124, 128, 239, 241

[56] References Cited

U.S. PATENT DOCUMENTS

| 5,015,177 | 5/1991 | Iwata | 432/128 |
|---|---|---|---|
| 5,202,716 | 4/1993 | Tateyama et al. | 432/121 |
| 5,277,579 | 1/1994 | Takanabe | 432/241 |
| 5,527,390 | 6/1996 | Ono et al. | 432/241 |
| 5,645,419 | 7/1997 | Ohsawa et al. | 432/241 |
| 5,697,749 | 12/1997 | Iwabuchi et al. | 432/239 |

*Primary Examiner*—Teresa Walberg
*Assistant Examiner*—Gregory A. Wilson
*Attorney, Agent, or Firm*—Jones, Volentine, Steinberg & Whitt, L.L.P.

[57] ABSTRACT

An apparatus for thermal processing of semiconductor wafers includes a table having in lateral sequence a heating chamber, a holding chamber, and a cassette stage and a boat for holding the wafers being processed. The apparatus further includes a boat transfer part for moving the boat between the holding chamber and the heating chamber, a wafer charging part for transferring the wafers loaded in a cassette on the cassette stage to the boat while it is in the holding chamber, and a wafer discharging part for transferring the wafers loaded in the boat back to the cassette on the cassette stage.

10 Claims, 4 Drawing Sheets

THERMAL PROCESSING APPARATUS FOR SEMICONDUCTOR WAFER

BACKGROUND OF THE INVENTION

1. Field of the Invention

This invention relates to an apparatus for processing semiconductor wafers, and in particular, to an apparatus for thermal processing of a plurality of semiconductor wafers simultaneously.

2. Description of the Related Art

In doped-poly processes performed by the batch method, three wafers per batch are sampled; one from the top, one from the middle, and one from the bottom of the stack of wafers that were processed together in the batch. These wafers are referred to as monitor wafers. After each process, the monitor wafers for the batch are subjected to thermal processing and their resistances are measured.

In those situations where a specific thermal processing apparatus for semiconductor wafers is not available, diffusion process equipment is used instead. FIG. 1 shows a conventional approach for using a diffusion process apparatus as a thermal processing unit. In FIG. 1, a front shutter 3 is positioned on one side of a thermal processing unit 1 for loading a cassette containing wafers (not shown) onto a cassette stage 2. The cassette is then moved up by an auto cassette loader 4 to an upper cassette end 5 and held there.

The cassette at the upper cassette end 5 is subsequently moved down to a lower cassette end 6 by the auto cassette loader 4. A wafer transferer 7 takes the monitor wafers out of the cassette one at a time and transfers them to a boat 8. The boat 8, now loaded with monitor wafers, is moved to a heating chamber 10 by a boat elevator 9.

When the thermal processing on these monitor wafers is complete, the boat 8 retracts from the heating chamber 10 and is lowered by the boat elevator 9. Then, the monitor wafers are transferred one at a time from the boat 8 back to the cassette at the lower cassette end 6 by the wafer transferer 7. After this, the cassette is moved up to the upper cassette end 5 by the auto cassette loader 4 and finally back to the cassette stage 2 for removal of the cassette.

The conventional thermal processing unit has certain disadvantages, such as a complicated structure, and the processing time for one operating cycle is lengthy. In addition, during one operating cycle, the conventional thermal processing unit only performs the process on three monitor wafers from a single batch, which adds substantially to the total time for processing several batches. Even if the number of monitor wafers to be processed during one cycle were increased, the unit would be idle until the desired number of wafers are accumulated. This extended processing time also affects subsequent processing steps, and causes delays in the total semiconductor device fabrication process.

SUMMARY OF THE INVENTION

Accordingly, the present invention is directed to a semiconductor wafer thermal processing apparatus that substantially overcomes one or more of the limitations and disadvantages of the related art due to the complexity and inefficiency of the conventional thermal processing unit.

To achieve these and other advantages, the present invention provides a thermal processing apparatus for semiconductor wafers comprising a table having in lateral sequence a heating chamber, a holding chamber, and a cassette stage. The apparatus also includes a boat for holding the wafers being processed and a boat transfer part for moving the boat between the holding chamber and the heating chamber. The apparatus further contains a wafer charging part for transferring the wafers loaded in a cassette on the cassette stage to the boat in the holding chamber, and a wafer discharging part for transferring the wafers loaded in the boat in the holding chamber to the cassette on the cassette stage.

In other aspects of the invention, a chamber door is installed between the heating chamber and the holding chamber, a front door is installed between the holding chamber and the cassette stage, a plurality of switches are installed on the table for manual control of the wafer charging part, wafer discharging part, and boat transfer part, and a monitor is installed on the table for observing the operation of the thermal process apparatus.

BRIEF DESCRIPTION OF THE DRAWINGS

The above objects, advantages, and other features of the present invention will be described in detail with reference to the attached drawings, in which.

DETAILED DESCRIPTION OF THE PRESENT INVENTION

Figure 1:
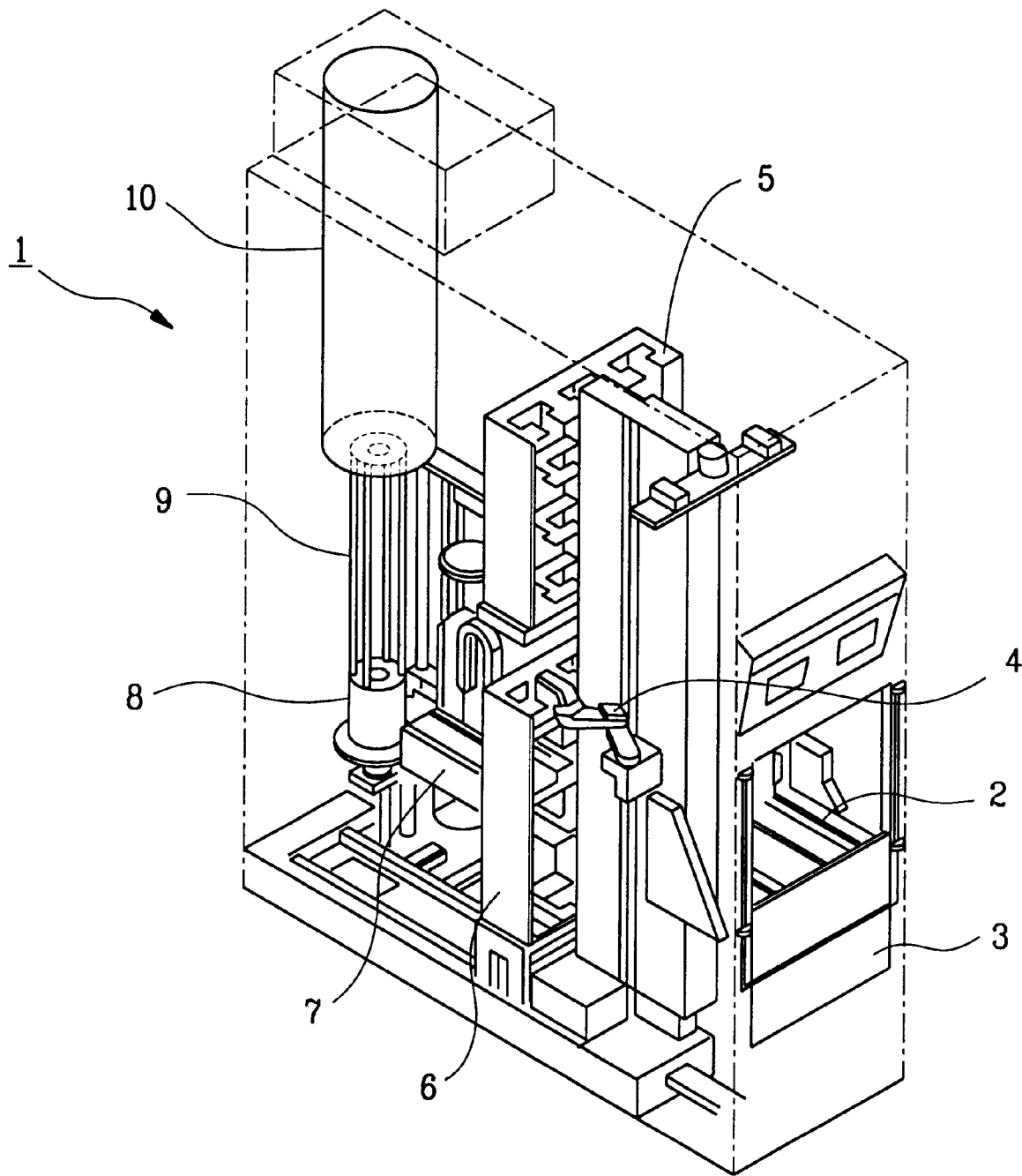
FIG. 1 is a perspective view of a conventional thermal processing unit.
Figure 2:
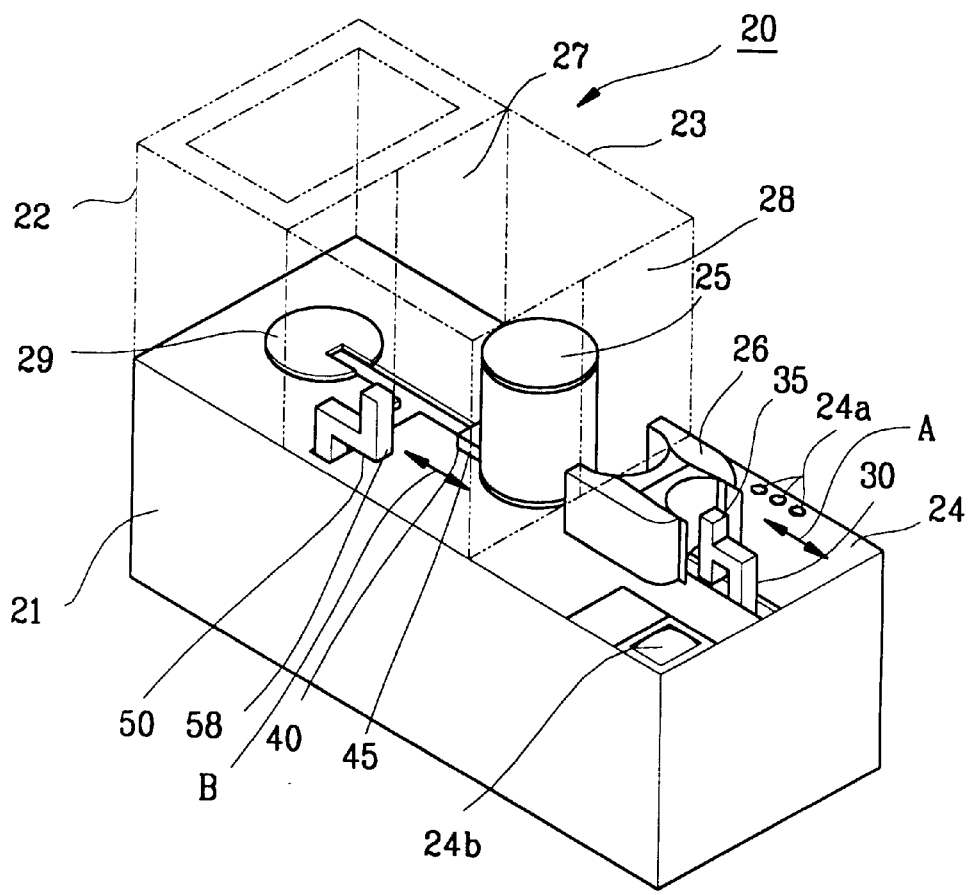
FIG. 2 is a perspective view of a thermal processing apparatus according to the present invention.

FIG. 2 illustrates a perspective view of the thermal processing apparatus 20 according to the present invention. On a table 21, there are positioned side by side, in order, a heating chamber 22, a holding chamber 23, and a cassette stage 24. A boat 25 loaded with wafers is positioned in the holding chamber 23. An empty cassette 26, which was formerly loaded with wafers, is positioned on the cassette stage 24. In the orientation shown in FIG. 2, a wafer charging part 30 installed on the cassette stage 24 has just transferred the wafers from the empty cassette 26 on the cassette stage 24 into the boat 25 in the holding chamber 23. The wafer charging part 30 moves in the direction indicated by arrow 'A'. The same empty cassette 26 may be left on the cassette stage 24 to receive the wafers after they have been thermally processed, or a new for the case where the same empty cassette 26 remains on the cassette stage 24.

A boat transfer part 40 installed in the holding chamber 23 operates to transfer the boat 25 loaded with the wafers from the holding chamber 23 to the heating chamber 22, or the reverse, in the direction of arrow 'B'. A wafer discharging part 50, installed in the holding chamber 23, pushes wafers out from the boat 25 and loads them into the empty cassette 26 on the cassette stage 24 after processing.

A chamber door 27 is installed between the heating chamber 22 and the holding chamber 23, and a front door 28 is installed between the holding chamber 23 and the cassette stage 24. The chamber door 27 is opened and closed in accordance with the transferring of the boat loaded with wafers between the holding chamber 23 and the heating chamber 22. The front door 28 is opened and closed in accordance with the charging and discharging of the boat 25 with the wafers. Switches 24a and a monitor 24b are positioned on the cassette stage 24 for manually or automatically operating and monitoring the thermal processing operation.

Figure 3:
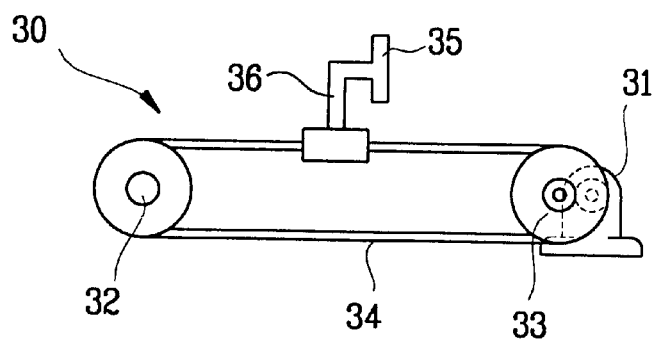
FIG. 3 is a front view of a wafer charging part according to the present invention.

As illustrated in FIG. 3, the wafer charging part 30 is composed of a pair of pulleys 32 and 33 driven by a reduction motor 31, and a wire rope or reinforced rubber belt 34 connecting pulleys 32, 33. A charge pusher 35 is fixed on the wire rope or reinforced rubber belt 34 so as to move back and forth as the reduction motor 31 turns one way or the other. In the normal direction of the reduction motor 31, the upper vertical face 36 of the pusher 35 would contact the edge of the wafers in the cassette 26 and push them toward the boat 25. In the reverse direction of the reduction motor 31 the pusher 35 is retracted. The direction of normal or reverse movement is indicated by arrow 'A' in FIG. 2.

Figure 4:
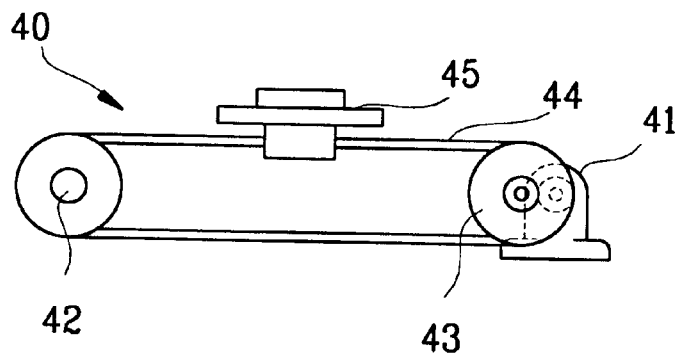
FIG. 4 is a front view of a boat transfer part according to the present invention.

As illustrated in FIG. 4, the boat transfer part 40 is composed of a pair of pulleys 42 and 43 driven by a reduction motor 41, and a wire rope or reinforced rubber belt 44 connecting pulleys 42, 43. A boat guide 45 is installed on the wire rope 44 so as to move back and forth along a wafer-transfer direction (arrow 'B' in FIG. 2) with the movement of wire rope or reinforced rubber belt 44 as the reduction motor 41 turns one way or the other. In the normal direction of the reduction motor 41, the boat guide 45 moves along the wafer-transfer direction toward the heating chamber 22. In the reverse direction of the reduction motor 31 the boat guide 45 moves along the wafer-transfer direction away from the heating chamber 22 and toward the cassette stage 24.

Figure 5:
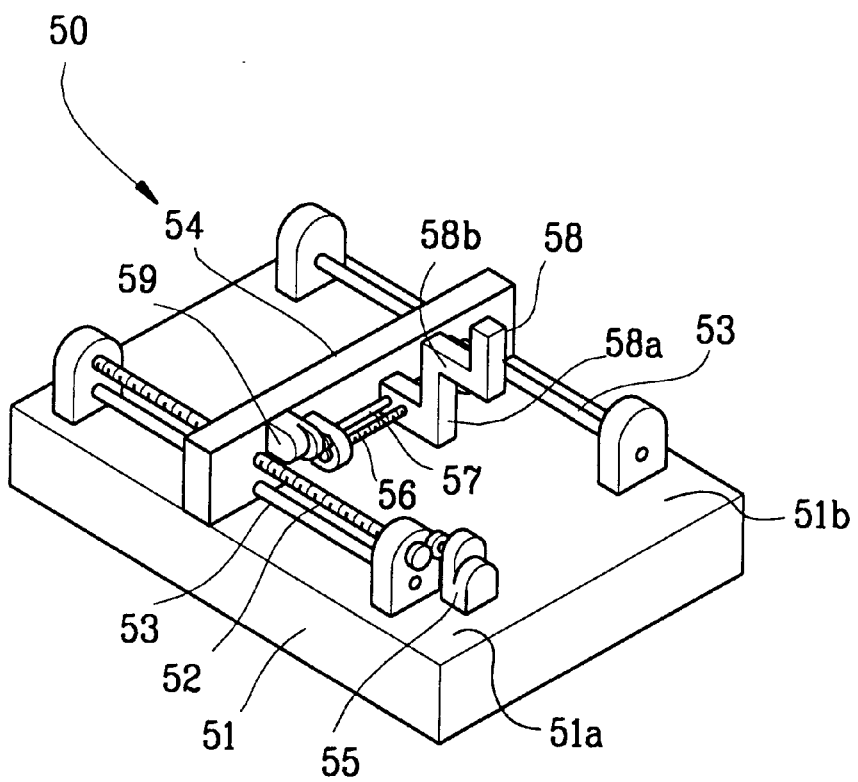
FIG. 5 is a perspective view of a wafer discharging part according to the present invention.

FIG. 5 illustrates the wafer discharging part 50 in detail. A base 51 has installed, along a first edge 51a, a first screw rod 52 and one of a pair of first guide rods 53. The other of the pair of first guide rods 53 is installed along a second edge 51b of the base 51. The first edge 51a and the second edge 51b and the screw rod 52 and the pair of guide rods 53 are all substantially parallel to the wafer-transfer direction as indicated by arrow 'B' in FIG. 2.

A horizontal frame 54 is installed substantially perpendicular to the first screw rod 52 and the first guide rods 53 so that the frame 54 moves back and forth along the wafer-transfer direction when driven by a first reduction motor 55 mounted to the base 51.

A second screw rod 56 and a second guide rod 57 are installed on one side of the horizontal frame 54 side by side so that they are substantially parallel to each other, and positioned so that they both are substantially perpendicular to the wafer-transfer direction. The second screw rod 56 and the second guide rod 57 pass through openings in the discharge pusher 58 so as to move the discharge pusher 58 back and forth substantially perpendicular to the wafer-transfer direction when driven by a second reduction motor 59 mounted to the horizontal frame 54.

The discharge pusher 58 consists of a vertical side 58a (in a plane substantially parallel to the horizontal frame 54) and a horizontal side 58b (in a plane substantially perpendicular to the horizontal frame 54). When the horizontal frame 54 is moved along the wafer-transfer direction, the discharge pusher 58 contacts the side of the wafers in the boat 25 and pushes the wafers out of the boat 25 and into the empty cassette 26 on the cassette stage 24.

The operation of the apparatus will be described with reference to FIG. 2, FIG. 6, and FIG. 7. As each batch of wafers pass through one process during semiconductor device fabrication, three wafers per batch, referred to as monitor wafers, are sampled. A total of 9 to 15 monitor wafers from 3 to 5 batches are loaded for one operation cycle into a cassette.

Referring to FIG. 2, the cassette 26 loaded with 9 to 15 monitor wafers is placed onto the cassette stage 24. Next, the front door 28 is opened, the wafers stored in the cassette 26 are transferred by the charge pusher 35 driven by the reduction motor 31 to the boat 25 lying on the boat guide 45 of the holding chamber 23. Then by the reverse rotation of the reduction motor 31, the charge pusher 35 is retracted to its starting position, and the front door 28 is closed.

Figure 6:
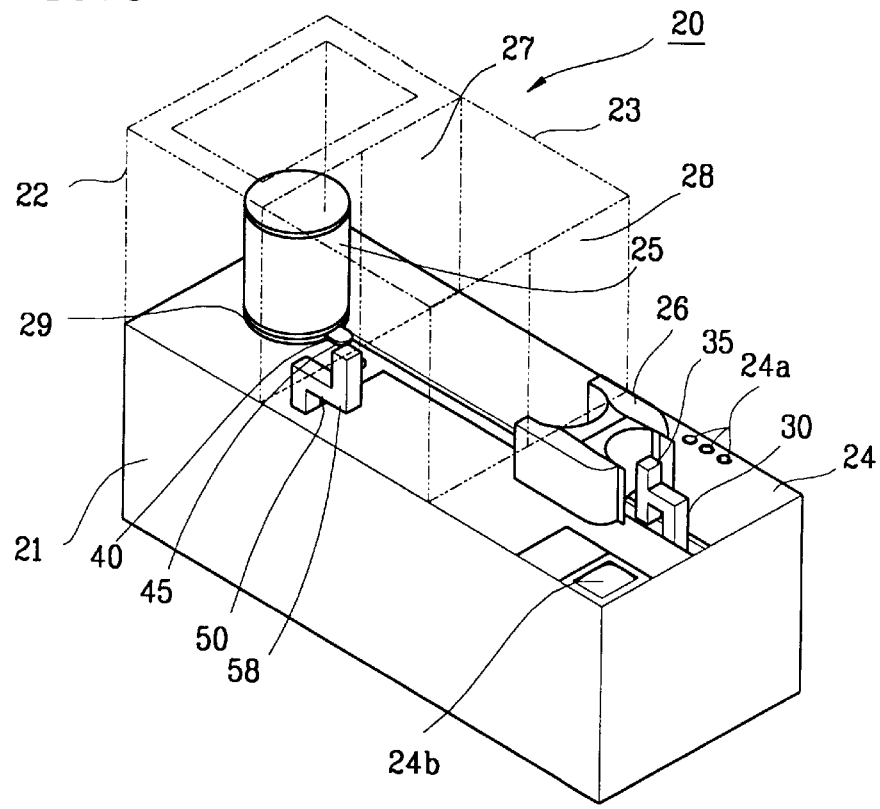
FIG. 6 is a perspective view showing the operating state of the thermal processing apparatus according to the present invention when the boat is in the heating chamber.
Figure 7:
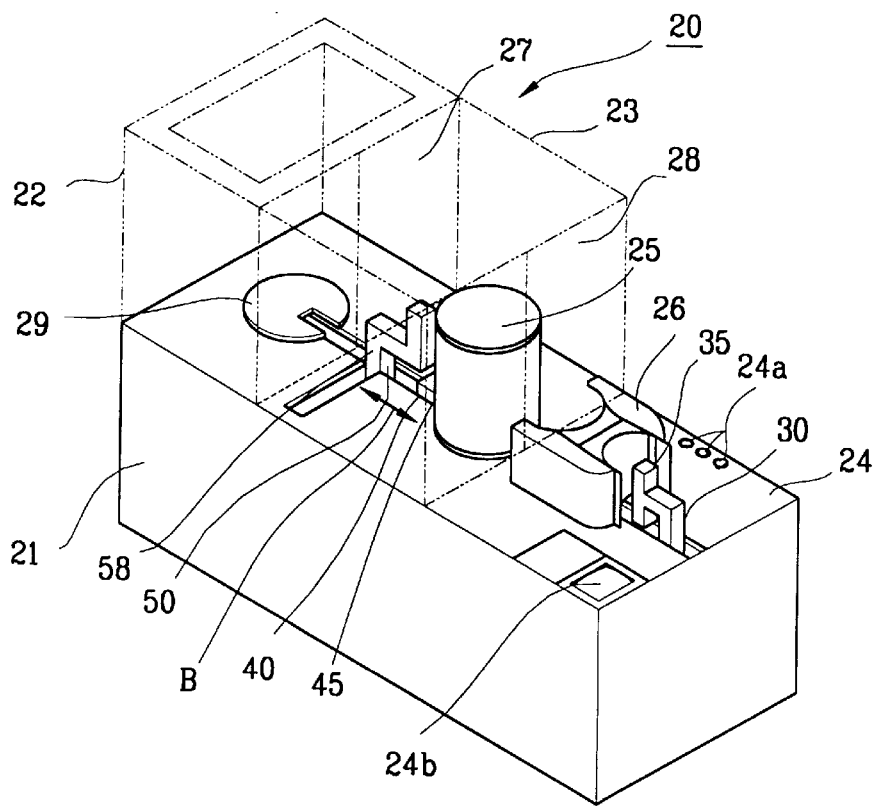
FIG. 7 is a perspective view showing the operating state of the thermal processing apparatus according to the present invention when the boat is in the holding chamber and the wafer discharging part is in position to discharge the wafers to the cassette on the cassette stage.

FIG. 6 shows the subsequent steps. The chamber door 27 is opened, and the boat 25 loaded with monitor wafers is taken to a plate 29 of the heating chamber 22 by the boat guide 45 driven by the transfer reduction motor 41. The boat guide 45 is taken back to the holding chamber 23 by the reverse rotation of the transfer reduction motor 41. Chamber door 27 is then closed and the wafers of the boat 25 are thermally annealed inside the heating chamber 22. Because the heating chamber 22 processes a boat containing 9 to 15 monitor wafers during one cycle, the thermal processing time for the monitor wafers is greatly reduced.

The next sequence of steps is illustrated with reference to FIG. 7. After the wafer thermal processing is complete, the chamber door 27 is opened, the boat guide 45 of the boat transfer part 40 driven by the reduction motor 41 transfers the boat 25 from the heating chamber 22 to the holding chamber 23, and the chamber door 27 is closed. Then, the front door 28 is opened, and the discharge pusher 58 of the wafer discharging part 50 moves sideways (perpendicular to the wafer-transfer direction) as driven by the second reduction motor 59 (see FIG. 5) to a position in the line where the boat 25 passes, with the pusher 58 being positioned between the boat 25 and the heating chamber 22.

The frame 54 is driven, along the wafer-transfer direction, toward the boat 25 by the first reduction motor 55 so that the discharge pusher 58 attached to the horizontal frame 54 pushes the monitor wafers out of the boat 25 and into the empty cassette 26 on the cassette stage 24. The discharge pusher 58 is then moved back away from the boat by the first reduction motor 55 and sideways by the second reduction motor 59. With the thermal processing complete, the discharge pusher is back in its original place, and the thermal processing apparatus is ready for a new load of monitor wafers.

The thermal processing apparatus may be operated automatically, or it may be operated manually using switches 24a positioned on the cassette stage 24. In either mode of operation, all processing steps can be observed through a monitor 24b positioned on the cassette stage 24.

The thermal processing apparatus of the present invention has a simple and efficient structure and operation, as described above, so that it reduces the processing cycle time and the expenses for the thermal processing operation. Therefore, the thermal processing is performed rapidly, which contributes to the rapid and efficient semiconductor devices fabrication process itself.

It will be apparent to those skilled in the art that various modifications and variations can be made in the thermal processing apparatus for semiconductor wafers that has been described and particularly shown above without departing from the spirit or scope of the invention as defined by the appended claims and their equivalents.

What is claimed is:

1. A thermal processing apparatus for semiconductor wafers comprising:
   a table having a heating chamber, a holding chamber, and a cassette stage, sequentially horizontally thereon;
   a boat for holding wafers being processed;
   a boat transfer part for moving the boat horizontally between the holding chamber and the heating chamber;
   a wafer charging part for transferring the wafers loaded in a cassette on the cassette stage to the boat in the holding chamber; and
   a wafer discharging part for transferring the wafers loaded in the boat in the holding chamber to the cassette on the cassette stage.

2. The thermal processing apparatus as in claim 1, further comprising:
   a chamber door installed between the heating chamber and the holding chamber; and
   a front door installed between the holding chamber and the cassette stage.

3. The thermal processing apparatus as in claim 1, further comprising:
   a plurality of switches installed on the table for manual control of the wafer charging part, wafer discharging part, and boat transfer part; and
   a monitor installed on the table for observing the operation of the thermal process apparatus.

4. The thermal processing apparatus as in claim 1, wherein the wafer charging part comprises:
   a pair of pulleys having a wire rope or reinforced rubber belt disposed therebetween;
   a reduction motor for driving the pulleys in normal or reverse rotation; and
   a charge pusher affixed to the wire rope or reinforced rubber belt to move the wafers from the cassette to the boat during normal rotation of the reduction motor, and to retract during reverse rotation of the reduction motor.

5. The thermal processing apparatus as in claim 1, wherein the boat transfer part comprises:
   a pair of pulleys having a wire rope or reinforced rubber belt disposed therebetween;
   a reduction motor for driving the pulleys in normal or reverse rotation; and
   a boat guide affixed to the wire rope or reinforced rubber belt to move the wafers from the holding chamber to the heating chamber in accordance with the rotation direction of the reduction motor.

6. The thermal processing apparatus as in claim 1, wherein the wafer discharging part comprises:
   a base;
   a first screw rod connected to a first edge of the base, the rod being aligned substantially parallel to a wafer-transfer direction;
   a pair of first guide rods attached to the first edge and a second edge of the base, each of the rods being aligned substantially parallel to the wafer-transfer direction;
   a horizontal frame disposed substantially perpendicular to the wafer-transfer direction, the frame having a plurality of openings through which the first screw rod and the pair of the first guide rods pass;
   a first reduction motor for rotating the first screw rod to move the frame back and forth substantially parallel to the wafer-transfer direction;
   a second screw rod connected to the frame and aligned substantially perpendicular to the wafer-transfer direction;
   a second guide rod attached to the frame and aligned substantially perpendicular to the wafer-transfer direction;
   a discharge pusher, having a plurality of openings through which the second screw rod and the second guide rod pass, for moving the wafers from the boat to the cassette during normal rotation of the first reduction motor and to retract during reverse rotation of the first reduction motor; and
   a second reduction motor for moving the discharge pusher back and forth substantially perpendicular to the wafer-transfer direction.

7. The thermal processing apparatus as in claim 6, wherein one of the openings in the frame has threads for communicating with the first screw rod.

8. The thermal processing apparatus as in claim 6, wherein one of the openings in the discharge pusher has threads for communicating with the second screw rod.

9. The thermal processing apparatus as in claim 6, the discharge pusher further comprising:
   an horizontal member and a vertical member forming an inverted L-shape for easy retraction after the wafers are discharged.

10. A thermal processing apparatus for semiconductor wafers, comprising:
   a table having a heating chamber, a holding chamber, and a cassette stage, sequentially positioned thereon;
   a boat for holding wafers being processed;
   a boat transfer part for moving the boat between the holding chamber and the heating chamber, the boat transfer comprising a pair of transfer pulleys having a transfer wire rope or reinforced rubber belt disposed therebetween, a transfer reduction motor for driving the transfer pulleys in normal or reverse rotation, and a boat guide affixed to the transfer wire rope or reinforced rubber belt to move the wafers from the holding chamber to the heating chamber in accordance with the rotation direction of the transfer reduction motor;
   a wafer charging part for transferring the wafers loaded in the cassette on the cassette stage to the boat in the holding chamber, the wafer charging part comprising a pair of charge pulleys having a charge wire rope or reinforced rubber belt disposed therebetween, a charge reduction motor for driving the charge pulleys in normal or reverse rotation, and a charge pusher affixed to the charge wire rope or reinforced rubber belt to move wafers from the cassette to the boat during normal rotation of the charge reduction motor and to retract during reverse rotation of the charge reduction motor;
   a wafer discharging part for transferring the wafers loaded in the boat in the holding chamber to the cassette on the cassette stage, the wafer discharging part comprising a base, a first screw rod connected to a first edge of the base, the rod being aligned substantially parallel to a wafer-transfer direction, a pair of first guide rods attached to the first edge and a second edge of the base and being aligned substantially parallel to the wafer-transfer direction, a horizontal frame disposed substantially perpendicular to the wafer-transfer direction, the frame having a plurality of openings through which the first screw rod and the pair of the first guide rods pass, a first reduction motor for rotating the screw rod to move the frame back and forth substantially parallel to the wafer-transfer direction, a second screw rod connected to the frame and aligned substantially perpendicular to the wafer-transfer direction, a second guide rod attached to the frame and aligned substantially perpendicular to the wafer-transfer direction, a discharge pusher, having a plurality of openings through which the second screw rod and the second guide rod pass, for moving the wafers from the boat to the cassette during normal rotation of the first reduction motor and to retract during reverse rotation of the first reduction motor, the discharge pusher having a horizontal member and a vertical member forming an inverted L-shape for easy retraction after the wafers are discharged, and a second reduction motor for moving the discharge pusher back and forth substantially perpendicular to the wafer-transfer direction;

a chamber door installed between the heating chamber and the holding chamber;

a front door installed between the holding chamber and the cassette stage;

a plurality of switches installed on the table for manual control of the wafer charging part, wafer discharging part, and boat transfer part; and a monitor installed on the table for observing the operation of the thermal process apparatus.

* * * * *